(12) United States Patent
Lee et al.

(10) Patent No.: US 8,562,742 B2
(45) Date of Patent: Oct. 22, 2013

(54) APPARATUS FOR RADIAL DELIVERY OF GAS TO A CHAMBER AND METHODS OF USE THEREOF

(75) Inventors: Jared Ahmad Lee, Santa Clara, CA (US); Martin Jeff Salinas, San Jose, CA (US); Ankur Agarwal, Mountain View, CA (US); Ezra Robert Gold, Sunnyvale, CA (US); James P. Cruse, Santa Cruz, CA (US); Aniruddha Pal, Santa Clara, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 477 days.

(21) Appl. No.: 12/907,947

(22) Filed: Oct. 19, 2010

(65) Prior Publication Data

US 2011/0265887 A1  Nov. 3, 2011

Related U.S. Application Data

(60) Provisional application No. 61/330,041, filed on Apr. 30, 2010.

(51) Int. Cl.
| | |
|---|---|
| *C23C 16/00* | (2006.01) |
| *C23C 16/455* | (2006.01) |
| *H01L 21/3065* | (2006.01) |

(52) U.S. Cl.
USPC .. 118/715; 118/733; 156/345.33; 156/345.34

(58) Field of Classification Search
USPC ................. 118/715, 733; 156/345.33, 345.34
See application file for complete search history.

(56) References Cited

U.S. PATENT DOCUMENTS

| | | | |
|---|---|---|---|
| 6,308,654 B1 * | 10/2001 | Schneider et al. | |
| 6,444,037 B1 * | 9/2002 | Frankel et al. | 118/715 |
| 7,850,779 B2 * | 12/2010 | Ma et al. | 118/715 |
| 8,343,307 B2 * | 1/2013 | Huston | 156/345.34 |
| 8,387,557 B2 * | 3/2013 | Singh et al. | 118/620 |
| 2002/0007791 A1 * | 1/2002 | Horiguchi et al. | 118/715 |
| 2002/0078893 A1 | 6/2002 | Os et al. | |
| 2004/0261720 A1 | 12/2004 | Tolmachev et al. | |
| 2006/0113038 A1 | 6/2006 | Gondhalekar et al. | |
| 2007/0231992 A1 | 10/2007 | Balasubramaniam | |
| 2010/0133255 A1 | 6/2010 | Bahng et al. | |
| 2011/0265887 A1 * | 11/2011 | Lee et al. | 137/334 |

OTHER PUBLICATIONS

International Search Report and Written Opinion mailed Jan. 12, 2012 for PCT Application No. PCT/US2011/033332.

* cited by examiner

*Primary Examiner* — Jeffrie R Lund
(74) *Attorney, Agent, or Firm* — Moser Taboada; Alan Taboada (57) ABSTRACT

Apparatus for the delivery of a gas to a chamber and methods of use thereof are provided herein. In some embodiments, a gas distribution system for a process chamber may include a body having a first surface configured to couple the body to an interior surface of a process chamber, the body having an opening disposed through the body; a flange disposed proximate a first end of the opening opposite the first surface of the body, the flange extending inwardly into the opening and configured to support a window thereon; and a plurality of gas distribution channels disposed within the body and fluidly coupling a channel disposed within the body and around the opening to a plurality of holes disposed in the flange, wherein the plurality of holes are disposed radially about the flange.

20 Claims, 5 Drawing Sheets

APPARATUS FOR RADIAL DELIVERY OF GAS TO A CHAMBER AND METHODS OF USE THEREOF

CROSS-REFERENCE TO RELATED APPLICATIONS

This application claims benefit of U.S. provisional patent application Ser. No. 61/330,041, filed Apr. 30, 2010, which is herein incorporated by reference.

FIELD

Embodiments of the present invention generally relate to substrate processing.

BACKGROUND

Ultra-large-scale integrated (ULSI) circuits may include more than one million electronic devices (e.g., transistors) that are formed on a semiconductor substrate, such as a silicon (Si) substrate, and cooperate to perform various functions within the device. Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants, for example, halogen-containing etchant gases, such as hydrogen bromide (HBr), chlorine ($Cl_2$), carbon tetrafluoride ($CF_4$), and the like. Such processes cause a residue to build up on the surfaces of the etched features, etch masks, and elsewhere on the substrate.

To remove the residues from processed substrates an abatement process may be performed. Conventionally, the abatement process includes heating the processed substrate to a desired temperature while providing one or more process gases to promote the outgassing of residues from the substrate surface. The outgassed residues may then be purged from the chamber. In a typical chamber used to perform the abatement process, the one or more process gases are provided via one or more shower heads disposed within the chamber. When using a chamber comprising an overhead heat source (e.g. a radiant heat source located in a top portion of the chamber) the one or more shower heads must be placed and configured in a manner as to not interfere with the transmission of heat. However, in such configurations, the one or more shower head may fail to provide an even radial distribution of the process gases to the substrate surface, resulting in an uneven outgassing of residues, thereby failing to completely remove the residues from the substrate uniformly.

Therefore, there is a need for an improved apparatus for the delivery of gas into a process chamber.

SUMMARY

Apparatus for the delivery of a gas to a chamber and methods of use thereof are provided herein. In some embodiments, a gas distribution system for a process chamber may include a body having a first surface configured to couple the body to an interior surface of a process chamber, the body having a opening disposed through the body; a flange disposed proximate a first end of the opening opposite the first surface of the body, the flange extending inwardly into the opening and configured to support a window thereon; and a plurality of gas distribution channels disposed within the body and fluidly coupling a channel disposed within the body and around the opening to a plurality of holes disposed in the flange, wherein the plurality of holes are disposed radially about the flange.

In some embodiments, a gas distribution system may include a process chamber having a substrate support; a heater module comprising one or more radiant heating elements disposed opposite a support surface of the substrate support; and a gas distribution system coupled to the process chamber between the heater module and the substrate support. The gas distribution system may include a body having a first surface configured to couple the body to an interior surface of the process chamber, the body having a opening disposed through the body, the opening providing a line of sight between the heater module and the substrate support; a flange disposed proximate a first end of the opening opposite the first surface of the body, the flange extending inwardly into the opening and configured to support a window thereon; and a plurality of gas distribution channels disposed within the body and fluidly coupling a channel disposed within the body and around the opening to a plurality of holes disposed in the flange, wherein the plurality of holes are disposed radially about the flange.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide a gas distribution system for delivery of a gas to a chamber. The inventive apparatus advantageously provides a substantially uniform radial gas delivery to a process chamber while not interfering with a transmission of heat from a heat source to the surface of a substrate when the gas distribution system is disposed between the heat source and the substrate.

The inventive apparatus may be used to advantage in many different processing systems. For example, referring to FIG. 1, in some embodiments, a processing system 100 may generally comprise a vacuum-tight processing platform 104, a factory interface 102, and a system controller 144. Examples of a processing system that may be suitably modified in accordance with the teachings provided herein include the Centura® integrated processing system, one of the PRODUCER® line of processing systems (such as the PRODUCER® GT™), ADVANTEDGE™ processing systems, or other suitable processing systems commercially available from Applied Materials, Inc., located in Santa Clara, Calif. It is contemplated that other processing systems (including those from other manufacturers) may be adapted to benefit from the present invention.

Figure 1:
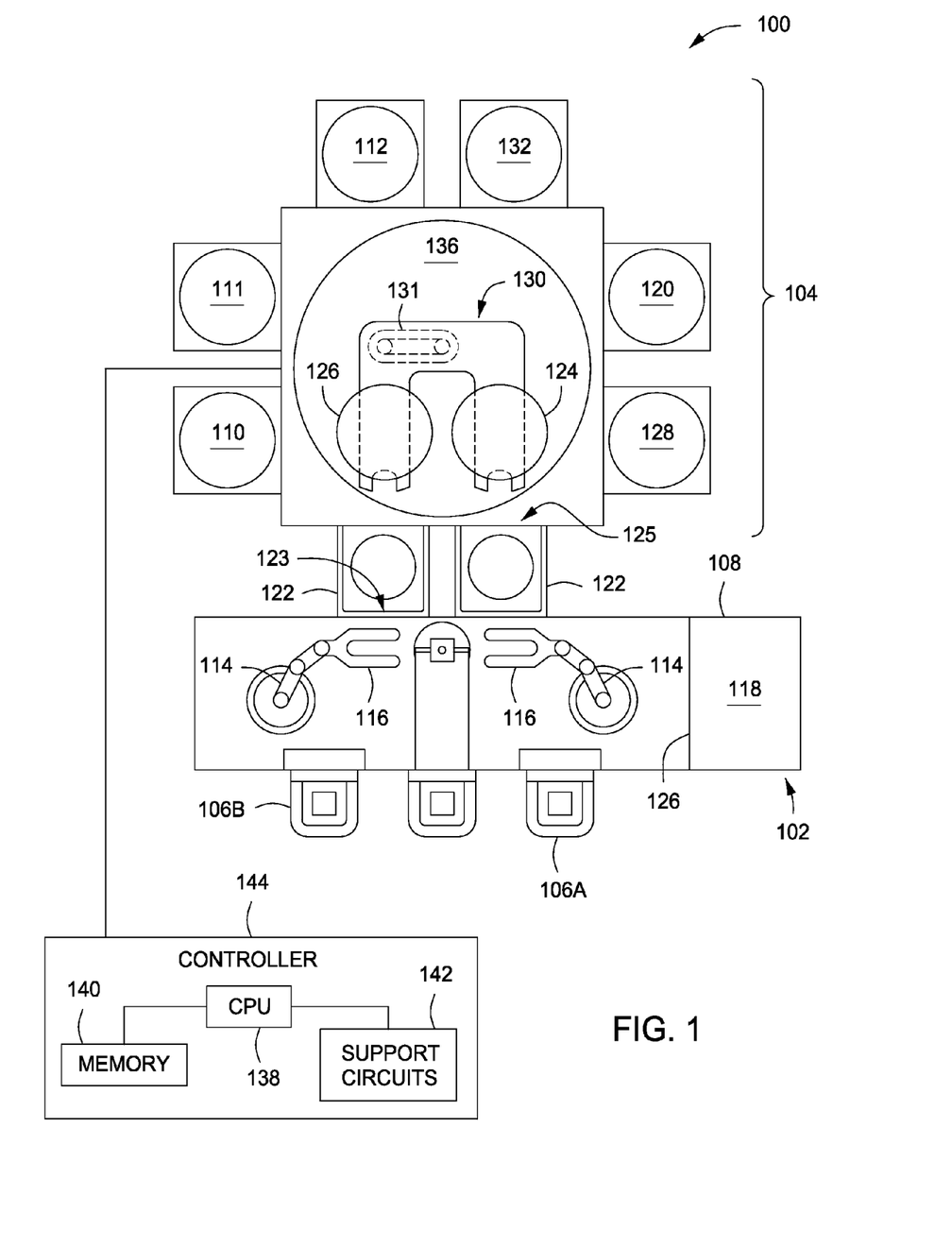
FIG. 1 depicts a schematic view of an exemplary processing system suitable for use with a process chamber having a gas distribution system in accordance with some embodiments of the present invention.

The platform 104 may include a plurality of process chambers (six shown) 110, 111, 112, 132, 128, 120 and at least one load-lock chamber (two shown) 122 that are coupled to a vacuum substrate transfer chamber 136. The factory interface 102 is coupled to the transfer chamber 136 via the load lock chambers 122. In some embodiments, for example, as depicted in FIG. 1, the process chambers 110, 111, 112, 132, 128, 120 may be grouped in pairs with each of the process chambers 110, 111, 112, 132, 128, 120 in each pair positioned adjacent to one another. One example of a twin chamber processing system that may be modified to incorporate the present invention in accordance with the teachings herein is described in U.S. Provisional Patent Application Ser. No. 61/330,156, filed Apr. 30, 2010, by Ming Xu et al., and entitled, "Twin Chamber Processing System." Each twin chamber processing system may include a pair of independent processing volumes that may be isolated from each other. For example, each twin chamber processing system may include a first process chamber and a second process chamber, having respective first and second processing volumes. The first and second processing volumes may be isolated from each other to facilitate substantially independent processing of substrates in each respective process chamber. The isolated processing volumes of the process chambers within the twin chamber processing system advantageously reduces or eliminates processing problems that may arise due to multi-substrate processing systems where the processing volumes are fluidly coupled during processing.

In such embodiments, the process chambers may be configured such that processing resources (i.e., process gas supply, power supply, or the like) may be shared between each of the process chambers 110, 111, 112, 132, 128, 120 within that pair. Thus, the twin chamber processing system further advantageously utilizes shared resources that facilitate reduced system footprint, hardware expense, utilities usage and cost, maintenance, and the like, while at the same time promoting higher substrate throughput. For example, shared hardware and/or resources may include one or more of a process foreline and roughing pump, AC distribution and DC power supplies, cooling water distribution, chillers, multi-channel thermo controllers, gas panels, controllers, and the like.

In some embodiments, the factory interface 102 comprises at least one docking station 108 and at least one factory interface robot (two shown) 114 to facilitate transfer of substrates. The docking station 108 is configured to accept one or more (two shown) front opening unified pods (FOUPs) 106A-B. In some embodiments, the factory interface robot 114 generally comprises a blade 116 disposed on one end of the robot 114 configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPs 106A-B.

In some embodiments, each of the load lock chambers 122 (described in more detail below) may comprise a first port 123 coupled to the factory interface 102 and a second port 125 coupled to the transfer chamber 136. The load lock chambers 122 may be coupled to a pressure control system (also described below) which pumps down and vents the load lock chambers 122 to facilitate passing the substrate between the vacuum environment of the transfer chamber 136 and the substantially ambient (e.g., atmospheric) environment of the factory interface 102.

In some embodiments, the transfer chamber 136 has a vacuum robot 130 disposed therein. The vacuum robot 130 generally comprises a one or more transfer blades (two shown) 134 coupled to a movable arm 131. In some embodiments, for example where the process chambers 110, 111, 112, 132, 128, 120 are arranged in groups of two as depicted FIG. 1, the vacuum robot 130 may comprise two parallel blades 134 configured such that the vacuum robot 130 may simultaneously transfer two substrates 124 between the load lock chambers 122 and the process chambers 110, 111, 112, 132, 128, 120.

The process chambers 110, 111, 112, 132, 128, 120 may be any type of process chamber utilized in substrate processing. For example, in some embodiments, at least one of the process chambers 110, 111, 112, 132, 128, 120 may be an etch chamber, deposition chamber, or the like. For example, in embodiments where at least one of the process chambers 110, 111, 112, 132, 128, 120 is an etch chamber, the at least one of the process chamber 110, 111, 112, 132, 128, 120 may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, or in combination, in some embodiments, at least one of the process chambers 110, 111, 112, 132, 128, 120 may be one of a HART™, E-MAX®, DPS®, DPS II, PRODUCER E, or ENABLER® etch chamber also available from Applied Materials, Inc. Other etch chambers, including those from other manufacturers, may be utilized.

In embodiments where the process chambers 110, 111, 112, 132, 128, 120 are etch chambers, for example, the process chambers 110, 111, 112, 132, 128, 120 may use a halogen-containing gas to etch a substrate (e.g., substrate 124) disposed therein. Examples of halogen-containing gases include hydrogen bromide (HBr), chlorine ($Cl_2$), carbon tetrafluoride ($CF_4$), and the like. After etching the substrate 124, halogen-containing residues may be left on the substrate surface. The halogen-containing residues may be removed by a thermal treatment process in the load lock chambers 122, for example, such as the thermal treatment process discussed below.

The system controller 144 is coupled to the processing system 100. The system controller 144 controls the operation of the system 100 using a direct control of the process chambers 110, 111, 112, 132, 128, 120 of the system 100 or alternatively, by controlling the computers (or controllers) associated with the process chambers 110, 111, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are coupled to the CPU 138 and may comprise cache, clock circuits, input/output subsystems, power supplies, and the like. The software routines, such as a method 500 for removing halogen-containing residues described below with reference to FIG. 5, when executed by the CPU 138, transform the CPU 138 into a specific purpose computer (controller) 144. The software routines may also be stored and/or executed by a second controller (not shown) that is located remotely from the system 100.

Figure 2:
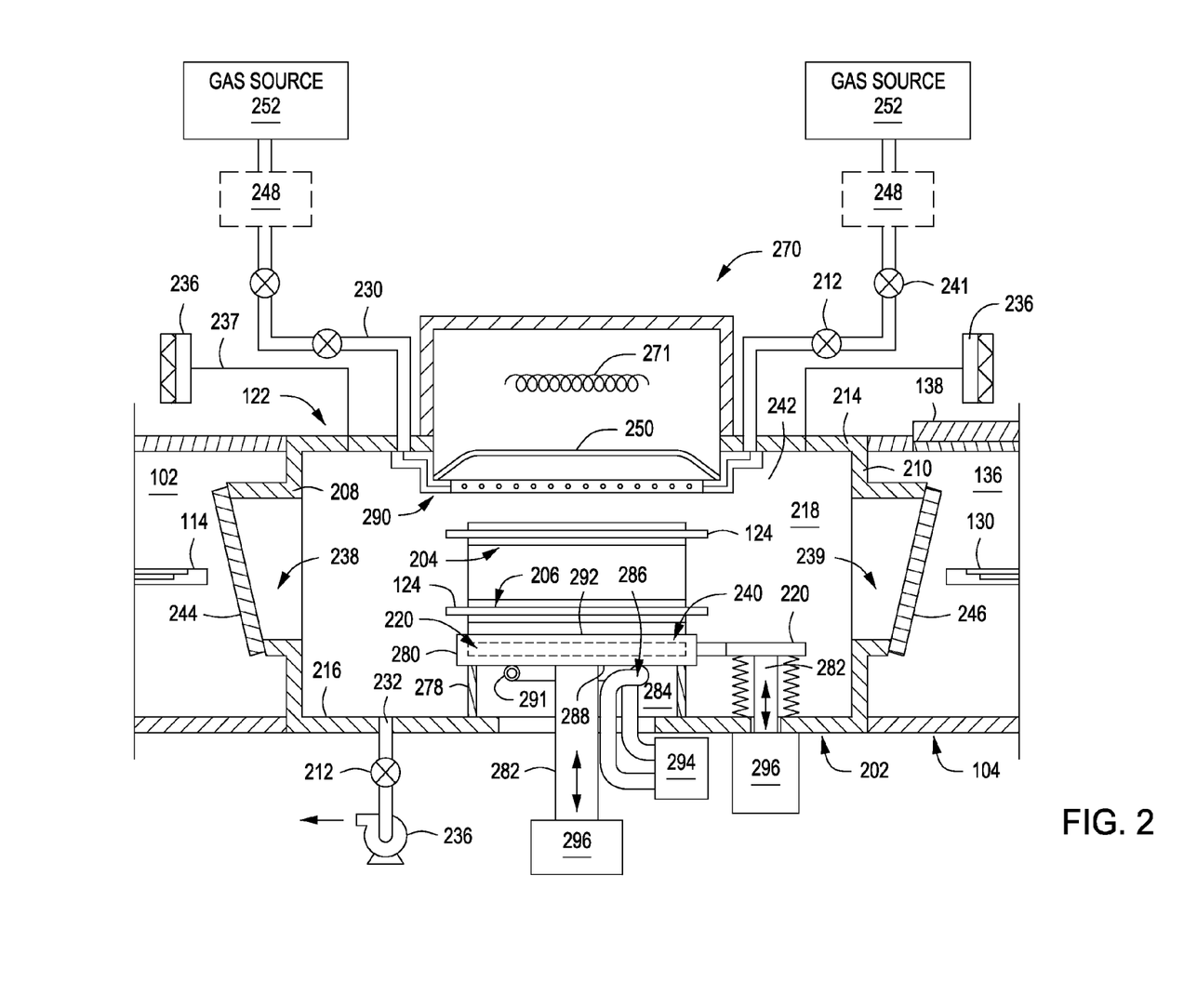
FIG. 2 depicts a sectional view of a load lock chamber having a gas distribution system in accordance with some embodiments of the present invention.

Referring to FIG. 2, in some embodiments, the load lock chamber 122 may generally comprise a chamber body 202, a first substrate holder 204, a second substrate holder 206, a temperature control pedestal 240 and a heater module 270 comprising one or more heating elements 271. The chamber body 202 may be fabricated from a singular body of material such as aluminum. The chamber body 202 includes a first side wall 208, a second side wall 210, lateral walls (not shown), a top 214 and a bottom 216 that define a chamber volume 218. A gas distribution ring 290 is coupled to the top 214 to facilitate a radial delivery of gas to the chamber volume 218 from one or more gas sources 252. The gas distribution ring 290 may be coupled to the top 214 in any manner suitable to form a vacuum seal between the gas distribution ring 290 and chamber body 202. For example, in some embodiments, the gas distribution ring 290 may be coupled to the top 214 via welding, or in some embodiments, may be coupled to the top 214 via a plurality of fasteners (e.g., screws, bolts, or the like).

A window 250 is disposed atop the gas distribution ring 290 and is at least partially covered by the heater module 270. In some embodiments, the window 250 is at least partially optically transparent to facilitate the transfer of heat from the heating elements 271 to the chamber volume 218. The window 250 may comprise any at least partially optically transparent material, such as a glass, crystalline material, or the like. In some embodiments, the window 250 comprises a silicon-based material, for example, quartz ($SiO_2$). Alternatively, in some embodiments, the window 250 may comprise sapphire.

Figure 3:
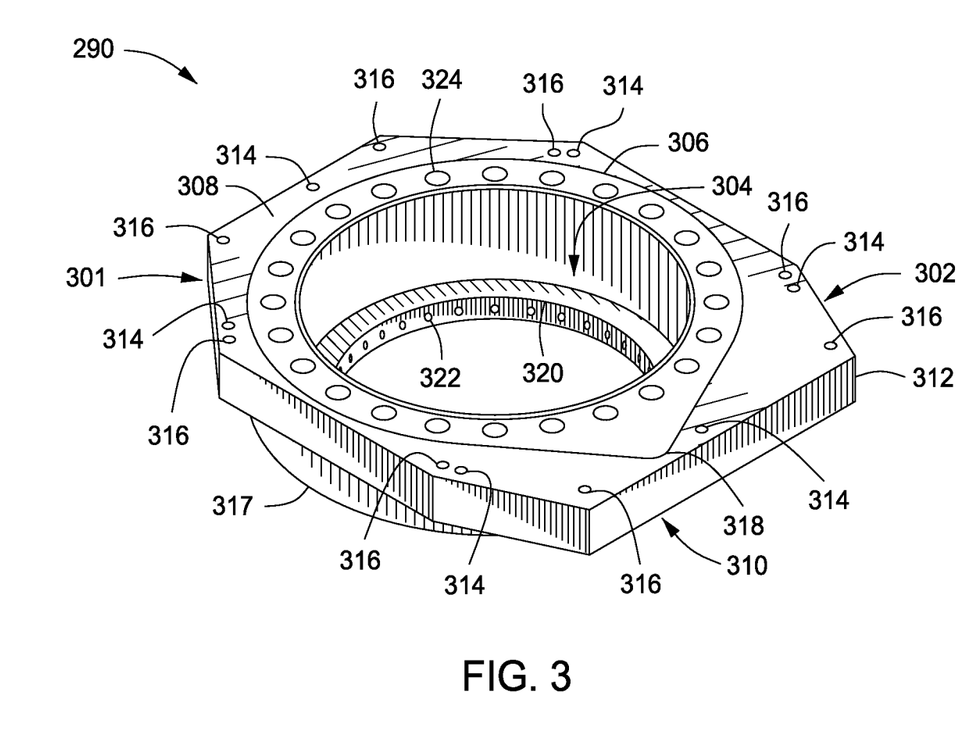
FIG. 3 depicts a perspective view of a gas distribution ring in accordance with some embodiments of the present invention.

The gas distribution ring 290 generally comprises a body having an opening configured to allow energy provided by the heater module 270 to pass therethrough and into the chamber volume 218. A plurality of gas distribution channels are disposed within the body and arranged about the opening to provide a radial distribution of gas into the chamber volume 218. For example, in some embodiments and as shown in FIG. 3, the gas distribution ring 290 may include a body 301 having a first surface 308 configured to couple the body to an interior surface of a process chamber (such as an upper surface of the load lock chamber 122).

In some embodiments, a plurality of insulating pads 324 may be provided atop the body 301 (or atop the cap 318, discussed below) to thermally insulate at least portions of the gas distribution ring 290 from the chamber body 202 (or other components such as a cooling ring, not shown, that removes undesired excess heat resultant from the heater module). In some embodiments, the insulating pads 324 may comprise a thin piece of a suitable thermal insulating material, such as polyimide (e.g., KAPTON®). The piece of material may have any suitable shape, such as a disk, square, rectangle, or the like. In some embodiments, each insulating pad 324 may be a polyimide disk having a thickness of about 0.005 inches and a diameter of about 0.25 inches.

The body 301 includes an opening 304 disposed through the body 301. A flange 320 may be disposed proximate a first end of the opening 304 opposite the first surface 308 of the body 301. The flange extends inwardly into the opening 304 and is configured to support the window 250 thereon. A plurality of gas distribution channels are disposed within the body 301 and fluidly couple a plenum formed within the body 301 to a plurality of holes 322 disposed in the flange 320. The plurality of holes 322 are disposed radially about the opening 304. In some embodiments, the plurality of holes 322 may be symmetrically disposed about the opening 304. In some embodiments, the plurality of holes 322 may be disposed substantially uniformly about the opening 304.

The body 301 may be fabricated from a single component or from a plurality of components. For example, in some embodiments, and as further detailed in FIG. 3, the gas distribution ring 290 may comprise a plate 302 having the upper surface 308 coupled to a lower surface 310 via sidewalls 312. The opening 304 is disposed through the plate 302. In some embodiments, a cylinder 306 may extend through the opening 304 in the plate 302. The cylinder 306 may extend past the lower surface 310 of the plate 302. The flange 320 may be disposed proximate a first end 317 of the cylinder 306 and extends inwardly into the opening 304. In some embodiments, the flange 320 is configured to support a window, for example, such as the window 250, described above.

In some embodiments, the flange 320 comprises a plurality of gas distribution channels (described below) respectively coupled to the plurality of holes 322 formed in the flange 320. In some embodiments, the channels extend through the cylinder 306 and are respectively fluidly coupled to a channel (described below) formed within the cylinder 306. In some embodiments, the cylinder 306 may include a cap 318 disposed atop the cylinder 306. The cap 318 covers the opening, to define a plenum (described below) for providing the plurality of gas distribution channels with a gas.

The gas distribution ring 290 may be fabricated from any material suitable for use in the environment of the particular process being performed, for example, such as a metal, ceramic, or the like. In some embodiments, the gas distribution ring 290 may be fabricated by a material transmissive to the heat generated from the heater module 270 such as not to substantially interfere with the heating of the substrates positioned on the substrate holders 204, 206. For example, in some embodiments, the gas distribution ring 290 may be fabricated from aluminum.

In some embodiments, the gas distribution ring 290 may be constructed from separate parts (e.g., the cylinder 306, plate 302 and cap 318) coupled to one another via, for example, welding or brazing. In some embodiments, the separate parts may be coupled to one another via a plurality of fasteners, for example bolts, screws, or the like. Alternatively, one or more parts of the gas distribution ring 290 may be fabricated from a single piece of material. For example, in some embodiments, the cylinder 306 and plate may be fabricated from a single piece of material. In such embodiments, the cap 318 may be separate and coupled to the gas distribution ring 290 via welding or brazing.

In some embodiments, a plurality of through holes 314 may be formed in the plate 302 to facilitate coupling the plate 302 to an interior surface of a process chamber, for example, the chamber body 202 of the load lock chamber 122 described above. In some embodiments, a plurality of insulation pads 316 may be disposed atop the plate 302 to thermally insulate the gas distribution ring 290 from the chamber body 202.

Figure 4:
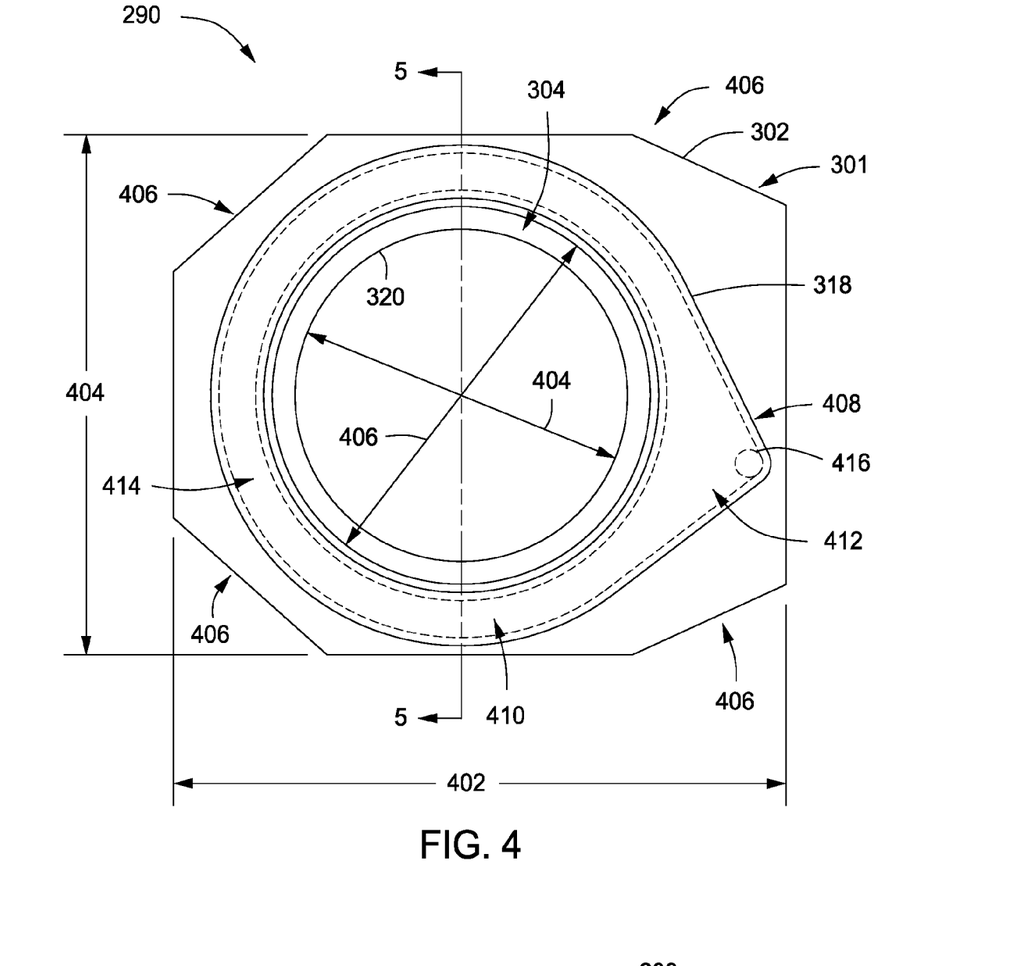
FIG. 4 depicts a top view of a gas distribution ring in accordance with some embodiments of the present invention.

FIG. 4 depicts a top view of the gas distribution ring 290 in accordance with some embodiments of the present invention.

As shown in FIG. 4, the cap 318 covers an channel in the body 301, or plate 302, (shown in phantom) that defines a plenum 410. In some embodiments, the cap 318 may rest on a shoulder 408 of the channel such that the cap 318 is disposed at least partially within the channel. The plenum 410 fluidly couples the plurality of holes 322 formed in the flange 320 together such that the pressure proximate each hole is more uniform, thereby promoting more uniform gas flow out of each second hole 322 and into the load lock chamber 122. In some embodiments, the plenum may have a non-uniform cross-section, such that a cross-sectional area in a first portion 412 is larger than a cross-sectional area in a second portion 414 of the plenum 410. In some embodiments, the gas from the gas source 252 may be provided proximate the first portion 412 in order to promote more uniform gas flow out of each second hole 322 and into the load lock chamber 122 due to the pressure change as the gas flows through the larger cross sectional area of the first portion 412 to the smaller cross-sectional area of the second portion 414. In some embodiments, the gas from the gas source 252 is supplied to the plenum via a hole 416 formed in the body 301. In some embodiments, the hole 416 is formed in a bottom surface of the plenum 410.

The gas distribution ring 290 may comprise any dimensions suitable to fit within the desired processing apparatus. For example, in some embodiments, the gas distribution ring 290 may comprise an overall length 402 of about 17 to about 18 inches, or in some embodiments, about 17.79 inches. In some embodiments, the gas distribution ring 290 may comprise a width 404 of about 15 to about 16 inches, or in some embodiments, about 15.28 inches. In addition, the opening 304 and the flange 320 may have any dimensions suitable to support a process window (described above). For example, in some embodiments, the opening 304 may have a diameter 406 of about 12 to about 13 inches, or in some embodiments, about 12.6 inches. In some embodiments, the flange 320 may extend into the opening 304 to reduce the diameter of the opening to a diameter 404 of about 11 to about 12 inches, or in some embodiments, about 11.325 inches. The plate 302 may also include additional features, for example, the corners of the plate 302 may comprise tapered sides 406 to facilitate a proper fit within the process chamber and to reduce the overall size of the gas distribution ring 290.

Figure 5:
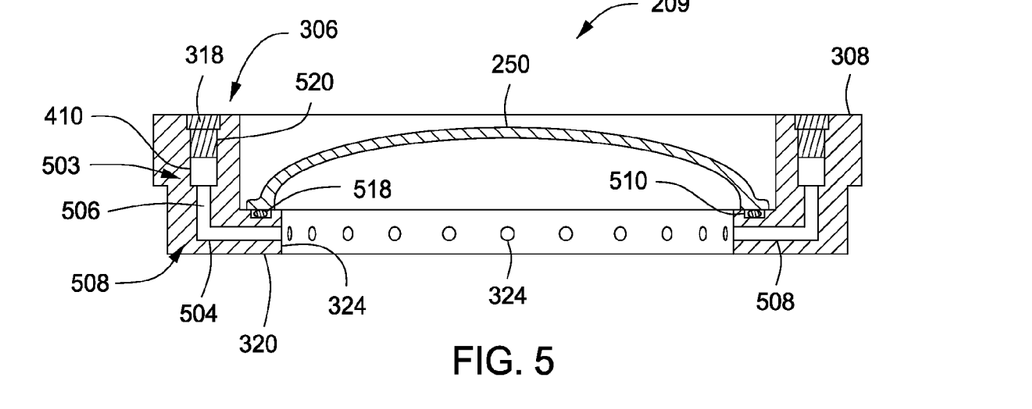
FIG. 5 depicts a cross sectional view of the gas distribution ring of FIG. 4 along the line 5-5 in accordance with some embodiments of the present invention.

Referring to FIG. 5, each of the gas distribution channels (two shown and labeled 508) formed in the body 301 (or the cylinder 306) and flange 320 may generally comprise a first section 504 generally oriented laterally and a second section 506 generally oriented vertically. In addition, each of the channels 508 are respectively fluidly coupled to a hole of the plurality of holes 324. Although the first section 504 and second section 506 are shown to be substantially perpendicular, each of the first section 504 and second section may be disposed at any suitable angle relative to one another and gas distribution ring 290 to facilitate even gas flow through the channels 508, thereby facilitating a consistent gas delivery from the gas distribution ring 290.

Any number of channels 508 may be formed in the cylinder 306 and flange 320 to facilitate the gas delivery from the gas distribution ring 290. For example, in some embodiments, two or more channels 508, or in some embodiments, about 24 channels 508, or in some embodiments, about 23 channels 508 may be formed in the cylinder 306 and flange 320. In addition, the channels 508 may be distributed throughout the cylinder 306 and flange 320 in any configuration suitable to provide the gas delivery in a desired pattern from the gas distribution ring 290. For example, in some embodiments, the channels 508 may be evenly spaced apart to facilitate an even radial gas distribution. For example, in embodiments where the cylinder comprises 24 channels 508, the channels 508 may be disposed at about 15 degree intervals around the cylinder 306 and flange 320.

The channels 508 may comprise any dimensions suitable to provide a desired flow of gas. For example, in some embodiments, the channels 508 may have a diameter of about 0.11 to about 0.19 inches. In some embodiments, the holes 324 may comprise the same, or different dimensions that that of the channels 508.

In some embodiments, an o-ring, or gasket, channel 510 may be formed in an upper surface of the flange 320 to secure one or more o-rings or gaskets 518 (one shown) to provide a vacuum seal between the window 250 and the flange 320, when the window 250 is disposed on an upper surface of the flange 320.

In some embodiments, one end 503 of the second section 506 of each the channels 508 may be coupled to the plenum 410. In such embodiments, the plenum 410 may form a continuous radial channel within the cylinder 306, thereby providing a simultaneous delivery of gas from a gas source (i.e., gas source 252 described above) to each of the channels 508. In embodiments where the plenum 410 is present, the cap 318 may be disposed atop the cylinder 306. In some embodiments, the cap 318 may comprise an insert 520 configured to fit within the plenum 410. The cap 318 may be coupled to the cylinder 306 via any coupling suitable to form a vacuum seal, for example via welding, brazing, or the like.

In operation, for example, the gas distribution ring 290 is coupled to an interior surface of a process chamber (e.g., load lock chamber 122 described above), creating a vacuum seal between the gas distribution ring 290 and the process chamber body. The process window 250 comprising at least a partially transparent material is disposed atop one or more o-rings 518. A process gas is supplied to the plenum 410 via a gas source (e.g., gas source 252 described above) and is distributed from the plurality of holes 324 via the channels 508. In some embodiments, the gas is distributed in a substantially uniform radial pattern, for example, each of the plurality of holes 324 distributes the gas at a pressure of less than about a 1 percent difference with respect to one another. In addition, in some embodiments, a pressure drop of the gas between the plenum and plurality of holes may be less than about 600 mTorr, or in some embodiments, about 500 mTorr.

Figure 6:
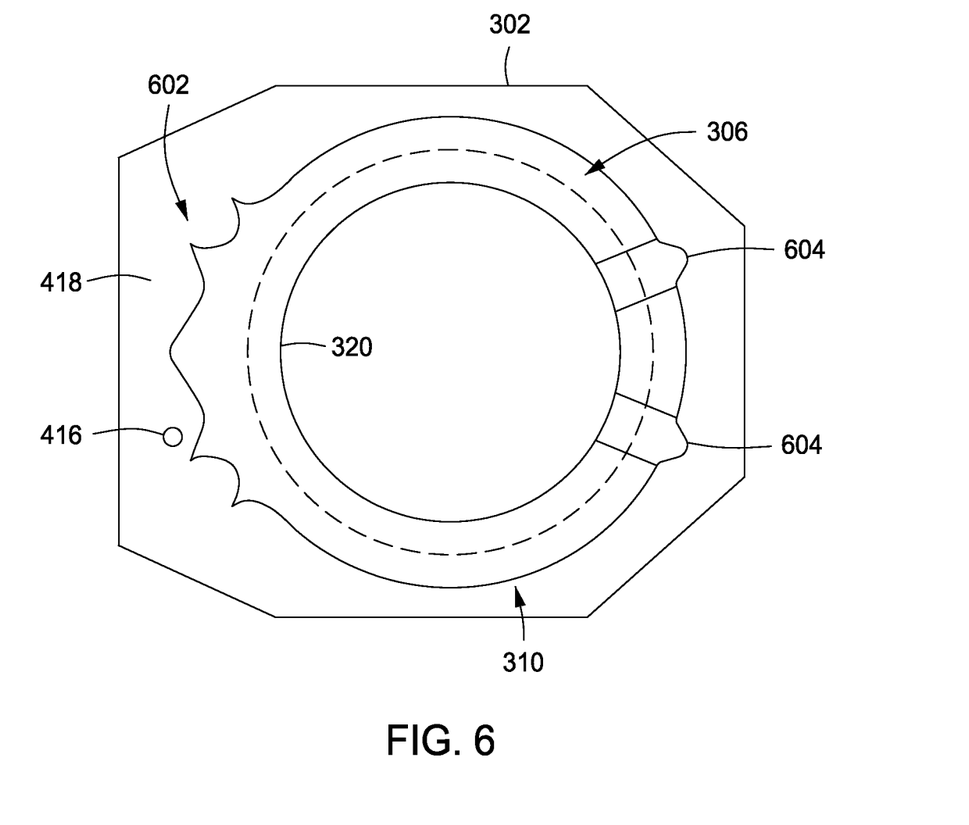
FIG. 6 depicts a bottom view of a gas distribution ring in accordance with some embodiments of the present invention.

Referring to FIG. 6, in some embodiments, additional features may be incorporated into the gas distribution ring 290. For example, in some embodiments the gas distribution ring 290 may comprise recesses, cutouts 604 or other features 602 configured to facilitate a proper fit of the gas distribution ring 290 within a process chamber (i.e., load lock chamber 122).

Returning to FIG. 2, the pressure of the chamber volume 218 may be controlled so that the load lock chamber 122 may be evacuated to substantially match the environment of the transfer chamber 136 and be vented to substantially match the environment of the factory interface 102. In some embodiments, the pressure of the chamber volume 218 may be controlled within a predetermined range that facilitates performing the residue removal process, as further described below. The chamber body 202 includes one or more vent passages 230 and a pump passage 232. The vent passage 230 and the pump passage 232 are positioned at opposite ends of the chamber body 202 to induce laminar flow within the chamber volume 218 during venting and evacuation to minimize particulate contamination. In some embodiments, the one or more vent passages 230 are coupled to the gas distribution ring 290 to provide a radial distribution of gas provided by one or more (two shown) gas sources 252 while the pump passage 232 is disposed through the bottom 216 of the chamber body 202. The passages 230, 232 typically are coupled to a valve 212 to selectively allow flow into and out of the chamber volume 218. In some embodiments, a high efficiency air filter 236 such as available from Camfil Farr, Inc., of Riverdale, N.J. may be coupled to the chamber body 202 via a vent line 237.

The vent passage 230 may be additionally coupled to the gas sources 252 through a valve 241 to provide a gas mixture into the chamber volume 218 via the gas distribution ring. The gas sources 252 may provide any gas required for a particular process being performed. For example, in some embodiments, the gas source 252 may provide at least one of nitrogen ($N_2$), hydrogen ($H_2$), alkanes, alkenes, oxygen ($O_2$), ozone ($O_3$), water vapor ($H_2O$), and the like.

In some embodiments, a remote plasma source (RPS) 248 may be coupled to the vent passage 230 to assist in removing the residues from the substrate surfaces. The remote plasma source 248 provides plasma formed from the gas mixture provided by the gas source 252 to the load lock chamber 122. In embodiments where the remote plasma source (RPS) 248 is present, a diffuser (not shown) may be disposed at the outlet of the vent passage 230 to facilitate delivery the generated plasma into the load lock chamber 122.

In some embodiments, the pump passage 232 is coupled to a point-of-use pump 236, such as available from Alcatel, headquartered in Paris, France. The point-of-use pump 236 may have a low vibration generation to minimize the disturbance of the substrate 124 positioned on the holders 204, 206 within the load lock chamber 122 while promoting pump-down efficiency and time by minimizing the fluid path between the load lock chamber 122 and pump 236.

A first loading port 238 is disposed in the first wall 208 of the chamber body 202 to allow the substrate 124 to be transferred between the load lock chamber 122 and the factory interface 102. A first slit valve 244 selectively seals the first loading port 238 to isolate the load lock chamber 122 from the factory interface 102. A second loading port 239 is disposed in the second wall 210 of the chamber body 202 to allow the substrate 124 to be transferred between the load lock chamber 122 and the transfer chamber 136. A second slit valve 246 which is substantially similar to the first slit valve 244 selectively seals the second loading port 239 to isolate the load lock chamber 122 from the vacuum environment of the transfer chamber 136.

The first substrate holder 204 is concentrically coupled to (i.e., stacked on top of) the second substrate holder 206 that is disposed above the chamber bottom 216. The substrate holders 204, 206 are generally mounted to a hoop 220 that is coupled to a shaft 282 that extends through the bottom 216 of the chamber body 202. The shaft 282 is coupled to a lift mechanism 296 disposed exterior to the load lock chamber 122 that controls the elevation of the substrate holders 204 and 206 within the chamber body 202. A bellows 284 is coupled between the hoop 220 and the bottom 216 of the chamber body 202 and disposed around the shaft 282 to provide a flexible seal between the second substrate holder 206 and the bottom 216, thus preventing leakage from or into the chamber body 202 and facilitating raising and lowing of the substrate holders 204, 206 without compromising the pressure within the load lock chamber 122.

In operation, for example, the first substrate holder 204 may be utilized to hold an unprocessed substrate from the factory interface 102 while the second substrate holder 206 is utilized to hold a processed substrate (e.g., an etched substrate) returning from the transfer chamber 136. The flow within the load lock chamber 122 during venting and evacuation is substantially laminar due to the position of the vent passage 230 and pump passage 232 and is configured to minimize particulate contamination.

In some embodiments, the temperature control pedestal 240 may be coupled to the bottom 216 of the chamber body 202 by a support 278. The support 278 may be hollow or include passages therethrough to allow fluids, electrical signals, sensor and the like to be coupled to the pedestal 240. Alternatively, the pedestal 240 may be movably coupled to the chamber body 202 by a second shaft 282 and lift mechanism 296. In that embodiment, the support 278 may include a bellows 284.

The temperature control pedestal 240 generally includes a platen 280 which is generally fabricated from a thermally conductive material, for example, such as aluminum or stainless steel, but may alternatively be comprised of other materials, such as ceramic. The platen 280 generally has a heat transfer element 286. The heater transfer element 286 may be a fluid passage disposed in the platen 280 or disposed in contact with a lower surface 288 of the platen 280. Alternatively, the heat transfer element 286 may be a circulated water jacket, a thermoelectric device, such as a Peltier device, or other structure that may be utilized to control the temperature of the platen 280.

In some embodiments, the heat transfer element 286 comprises a tube 291 disposed in contact with the lower surface 288 of the platen 280. The tube 291 is coupled to a fluid source 294 that circulates a fluid through the tube. The fluid, for example, facility water from the fluid source 294, may optionally be thermally regulated. The tube 291 may be disposed in a substantially circular or spiral pattern against the lower surface 288 of the platen 280. Typically, the tube 291 is brazed to or clamped against the lower surface 288 or adhered using a conductive adhesive. Optionally, a conductive plate (not shown), such as a copper plate may alternatively be disposed between the tube 291 and platen 280 to promote uniformity of heat transfer across the width of the platen 280.

The hoop 220 having the substrate holders 204, 206 coupled thereto may be lowered to a first position where an upper surface 292 of the platen 280 is in close proximity or in contact with the substrate supported by the second substrate holder 206. In the first position, the platen 280 may be used to regulate the temperature of the substrate disposed on (or proximate to) the platen 280. For example, a substrate returning from processing may be cooled in the load lock chamber 122 by supporting the substrate during the evacuation of the load lock chamber 122 on the upper surface 292 of the platen 280. Thermal energy is transferred from the substrate through the platen 280 to the heat transfer element 286, thereby cooling the substrate. After cooling the substrate, the substrate holders 204, 206 may be raised towards the top 214 of the chamber body 202 to allow the robots 130, 114 to access to the substrate seated in the second substrate holder 206. Optionally, the holders 204, 206 may be lowered to a position where the upper surface 292 is in contact or close proximity to the substrate supported by the first substrate holder 204. In this position, the platen 280 may be used to thermally regulate and heat the substrate.

In some embodiments, in operation, the load lock chamber 122 facilitates the transfer of substrates between the ambient atmosphere of the factory interface 102 and the vacuum atmosphere of the transfer chamber 136. The load lock chamber 122 temporarily houses the substrate while the atmosphere within the load lock chamber 122 is adjusted to match the atmosphere of the transfer chamber 136 or factory interface 102 into which the substrate is to be transferred. For example, the first slit valve 244 is opened while the load lock chamber 122 is vented to substantially atmospheric pressure to match the atmosphere of the factory interface 102. The factory interface robot 120 transfers an unprocessed substrate from one of the FOUPs 106A-B to the first substrate holder 204. The substrate subsequently transfers to the process chambers 110, 111, 112, 132, 128, 120 to perform an etch process. After the etch process is completed, the pump passage 232 in the load lock chamber 122 is subsequently opened and the load lock chamber 122 is pumped down to the pressure substantially equal to the pressure of the transfer chamber 136. Once the pressures within the load lock chamber 122 and transfer chamber 136 are substantially equal, the second slit valve 246 is opened. The processed substrate is transferred to position on the second substrate holder 206 by the transfer robot 130 in the load lock chamber 122. The second slit valve 246 is closed once the blade of the transfer robot 130 is removed.

In some embodiments, for example where an etch process is performed, a residue removal process may be performed in the load lock chamber 122. In such embodiments, during the residue removal process, the second substrate holder 206 may be raised the processed substrate toward the heater module 270 to increase heating efficiency, thereby converting the residues to volatile compounds that may be pumped out of the load lock chamber 122. During the removal process, one or more process gases may be supplied into the load lock chamber 122 to promote residue removal. After the residues on the processed substrate surface has been partially or totally outgassed from the substrate surface, the vent passage 230 is opened in the load lock chamber 122 to allow the pressure in the load lock chamber 122 to raise to substantially match the pressure in the factory interface 102, thereby facilitating the processed substrate being transferred to the FOUPs 106A-B. While venting, the pedestal 240 is raised to contact the processed substrate rest on the second substrate holder 206. The processed substrate is thus cooled by transferring heat through the pedestal 240 to the fluid circulating in the tube 291. Once the pressures are matched, the first slit valve 244 is opened to allow the factory interface robot 114 to access the load lock chamber 122 to remove the processed substrate from the second substrate holder 206 and return to one of the FOUPs 106A-B. As such, as the substrate cooling process and the load lock chamber venting process is performed simultaneously, the overall process period and cycle time is reduced and productivity and throughput is increased. A newly unprocessed substrate from the FOUPs 106A-B may be transferred into the load lock chamber 122 on the first substrate holder 204 as the processed substrate removed from the second substrate holder 206 by the factory interface robot 114 while the slit valve 244 the load lock chamber 122 remains opened.

After completion of the substrate transfer, the first slit valve 244 and vent passage 230 are closed. The pump passage 232 is subsequently opened and the load lock chamber 122 is pumped down to the pressure substantially equal to the pressure of the transfer chamber 136. Once the pressure of the load lock chamber 122 and the transfer chamber 136 are substantially equal, the second slit valve 246 is opened and the transfer robot 130 then retrieves the newly unprocessed substrate for position in the first substrate holder 204 for processing in one or more of the process chambers 110, 112, 132, 128, 120 circumscribing the transfer chamber 136 to repeatedly and consecutively perform the etch process and halogen-containing residue removal process as stated above. After substrate transfer is completed, the second slit valve 246 is closed to seal the load lock chamber 122 from the transfer chamber 136 as stated above.

Thus, the present invention provides an apparatus for radial delivery of gas to a process chamber. The inventive apparatus advantageously provides a substantially symmetric and/or uniform radial gas delivery to a process chamber while not interfering with a transmission of heat from a heat source to the surface of a substrate.

While the foregoing is directed to embodiments of the present invention, other and further embodiments of the invention may be devised without departing from the basic scope thereof.

The invention claimed is:

1. A gas distribution system for a process chamber, comprising:
   a body having a first surface configured to couple the body to an interior surface of a process chamber, the body having a opening disposed through the body;
   a flange disposed proximate a first end of the opening opposite the first surface of the body, the flange extending inwardly into the opening and configured to support a window thereon; and
   a plurality of gas distribution channels disposed within the body and fluidly coupling a channel disposed within the body and around the opening to a plurality of holes disposed in the flange, wherein the plurality of holes are disposed radially about the flange.

2. The gas distribution system of claim 1, wherein the body comprises:
   a plate having the first surface configured to couple the plate to the interior surface of the process chamber, the plate further having the opening disposed through the plate; and
   a cylinder extending from the plate on a side of the plate opposing the first surface and having the opening extending therethrough, wherein the flange is disposed proximate a first end of the cylinder opposite the plate.

3. The gas distribution system of claim 1, wherein the body further comprises:
   a cap disposed in an upper portion of the channel to form a plenum.

4. The gas distribution system of claim 3, wherein the plenum has a first cross sectional area proximate a gas inlet to receive a gas from a gas distribution source and a second cross sectional area disposed on an opposing side of the opening, wherein the first cross sectional area is larger than the second cross sectional area.

5. The gas distribution system of claim 1, wherein the plurality of gas distribution channels comprise a diameter of about 0.11 to about 0.19 inches.

6. The gas distribution system of claim 1, further comprising:
   a window disposed within the opening and atop the flange, wherein the flange is configured to form a vacuum seal with the window.

7. The gas distribution system of claim 6, wherein the window comprises at least one of quartz or sapphire.

8. The gas distribution system of claim 1, wherein the top surface of the body is configured to form a vacuum seal with the process chamber when coupled to the interior surface of the process chamber.

9. The gas distribution system of claim 1, wherein the body comprises at least one of aluminum, or stainless steel.

10. The gas distribution system of claim 1, wherein the plurality of second holes are disposed symmetrically about the flange to provide a radial distribution of the gas.

11. The gas distribution system of claim 1, wherein the plurality of gas distribution channels comprises about 2 or more channels.

12. A gas distribution system, comprising:

a process chamber having a substrate support;

a heater module comprising one or more radiant heating elements disposed opposite a support surface of the substrate support; and a gas distribution system coupled to the process chamber between the heater module and the substrate support, comprising:

a body having a first surface configured to couple the body to an interior surface of the process chamber, the body having a opening disposed through the body, the opening providing a line of sight between the heater module and the substrate support;

a flange disposed proximate a first end of the opening opposite the first surface of the body, the flange extending inwardly into the opening and configured to support a window thereon; and a plurality of gas distribution channels disposed within the body and fluidly coupling a channel disposed within the body and around the opening to a plurality of holes disposed in the flange, wherein the plurality of second holes are disposed radially about the flange.

13. The gas distribution system of claim 12, wherein the body comprises:

a plate having the first surface configured to couple the plate to the interior surface of the process chamber, the plate further having the opening disposed through the plate; and a cylinder extending from the plate towards an inner volume of the process chamber and having the opening extending therethrough, wherein the flange is disposed proximate a first end of the cylinder opposite the plate.

14. The gas distribution system of claim 12, wherein the body comprises:

a cap disposed in an upper portion of the channel to form a plenum.

15. The gas distribution system of claim 14, wherein the plenum has a first cross sectional area proximate a gas inlet to receive a gas from a gas distribution source and a second cross sectional area disposed on an opposing side of the opening, wherein the first cross sectional area is larger than the second cross sectional area.

16. The gas distribution system of claim 12, further comprising:

a window disposed within the opening and atop the flange, wherein the flange is configured to form a vacuum seal with the window.

17. The gas distribution system of claim 12, wherein the top surface of the body is configured to form a vacuum seal with the process chamber when coupled to the interior surface of the process chamber.

18. The gas distribution system of claim 12, wherein the wherein the body comprise at least one of aluminum or stainless steel.

19. The gas distribution system of claim 12, wherein the plurality of gas distribution channels are disposed symmetrically about the flange to provide a radial distribution of the gas.

20. The gas distribution system of claim 12, wherein the process chamber is a load lock chamber.

* * * * *